United States Patent [19]
Takagi et al.

[11] Patent Number: 6,153,522
[45] Date of Patent: Nov. 28, 2000

[54] SEMICONDUCTOR DEVICE MANUFACTURING METHOD

[75] Inventors: Hideo Takagi; Shigetaka Uji; Shyoji Hirao, all of Kanagawa, Japan

[73] Assignee: Fujitsu Limited, Kawasaki, Japan

[21] Appl. No.: 09/179,886

[22] Filed: Oct. 28, 1998

[30] Foreign Application Priority Data

Oct. 19, 1997 [JP] Japan ................................ 9-298109

[51] Int. Cl.$^7$ .................................................. H01L 21/44
[52] U.S. Cl. ......................... 438/687; 438/677; 437/228; 257/751
[58] Field of Search ................... 438/687, 677; 437/228; 257/751

[56] References Cited

U.S. PATENT DOCUMENTS 5,569,627  10/1996  Shinohara et al. ................. 437/228
5,973,400  10/1999  Murakami et al. .................. 257/751

FOREIGN PATENT DOCUMENTS 4-217386  8/1992  Japan.

*Primary Examiner*—Richard Elms
*Assistant Examiner*—Pho Luu
*Attorney, Agent, or Firm*—Armstrong, Westerman, Hattori, McLeland & Naughton

[57] ABSTRACT

A semiconductor device manufacturing method of the present invention comprises the steps of forming a groove on an insulating film formed over a semiconductor substrate, forming a first copper film on the insulating film and in the groove by sputtering using a target, reflowing the first copper film by heating it, growing a second copper film on the first copper film by plating or chemical vapor deposition, and removing the second copper film and the first copper film on the insulating film by chemical mechanical polishing to remain at least the first copper film in the groove. Accordingly, in the semiconductor device manufacturing method to provide copper wirings, increase in resistance can be suppressed by firmly embedding copper into the groove and also electromigration resistance of copper wirings can be improved.

13 Claims, 4 Drawing Sheets

SEMICONDUCTOR DEVICE MANUFACTURING METHOD

BACKGROUND OF THE INVENTION

1. Field of the Invention

The present invention relates to a semiconductor device manufacturing method and, more particularly, semiconductor device manufacturing method of providing copper wirings.

2. Description of the Prior Art

In the step that copper wiring is formed in a semiconductor device, a method of embedding copper into the groove formed in the insulating film has been employed.

As the method of embedding the copper into the groove, there are the method of forming the copper film in the groove by using sputtering, the method of growing the copper film on the insulating film and in the groove by using plating or chemical vapor deposition, etc. In the case of sputtering, since a concave portion is formed on the upper surface of the copper film over the groove, the method of planarizing the upper surface of the copper film by reflowing the copper film is employed.

Also, it has been recorded in Patent Application Publication (KOKAI) Hei 4-217386 that, after the first copper film has been formed on the insulating film and in the groove by using sputtering, the second copper film is formed on the first copper film by virtue of electroplating while using the first copper film as the electrode.

The copper film being formed by any method is removed from the upper surface of the insulating film by virtue of CMP (chemical mechanical polishing) to be remained only in the groove. Then, the copper film remaining along the groove is used as the wiring.

According to the sputtering method, the copper film is easy to grow in the vertical direction of the substrate but is difficult to grow in the lateral direction of the substrate. As a consequence, there has been such a tendency that the copper film formed along the inner periphery of the groove of the insulating film becomes thinner while the copper film formed on the bottom of the groove and the upper surface of the insulating film becomes thicker.

Therefore, a concave portion occurs on the surface of the copper film over the groove. If the copper film is polished by chemical mechanical polishing in the situation that such groove remains as it is, wiring resistance is increased since groove or dishing is generated in the copper film which has remained in the groove. This is because such chemical mechanical polishing is attended with chemical reaction, so that the concave portion cannot be eliminated. In this case, even if the copper film is heated to reflow, the concave portion does not sufficiently disappear.

In contrast, according to the electroplating method, a cavity is ready to occur in metal which has been grown in the groove as an aspect ratio of the groove becomes higher, whereby higher resistance is caused in the groove. Such problem has been reported in Patent Application Publication (KOKAI) Hei 6-326055.

In addition, the copper film which is formed by the plating or the chemical vapor deposition has insufficient electromigration resistance to thus reduce reliability of the wiring.

Besides, as set forth in Patent Application Publication (KOKAI) Hei 4-217386, according to the method in which the second copper film is embedded into the groove by plating immediately after the first copper film is formed along the inner surface of the groove by sputtering, since a shape of the groove is substantially reflected on a shape of the first copper film, the cavity which is the defect of the plating method is ready to occur with the increase in the aspect ratio.

SUMMARY OF THE INVENTION

It is an object of the present invention to provide a semiconductor device manufacturing method which is capable of suppressing increase in resistance by firmly embedding copper into a groove, and also improving electromigration resistance of copper wirings.

According to the present invention, a groove is formed on an insulating film, then a first copper film is formed in the groove by the sputtering method, then the first copper film is heated to reflow, then a second copper film is formed on the first copper film by the chemical vapor deposition or the plating, then the first copper film and the second copper film are removed from a surface of the insulating film by chemical mechanical polishing, whereby a copper wiring is formed in the groove.

In this manner, a concave portion of the first copper film, which is generated in or over the groove, becomes shallow by reflowing the first copper film before the second copper film is formed, so that an upper surface of the second copper film is formed flat. As a result, neither groove nor dishing is generated on the copper film remaining in the groove after the chemical mechanical polishing is effected.

In addition, since the first copper film which is formed by sputtering remains in the groove, such copper film with good electromigration resistance can be left in the groove.

DESCRIPTION OF THE PREFERRED EMBODIMENTS

Embodiments of the present invention will be explained in detail with reference to the accompanying drawings hereinafter.

(First Embodiment)

FIGS. 1A to 1G are sectional views showing steps of forming wirings of a semiconductor device according to a first embodiment of the present invention respectively.

Figure 1A:
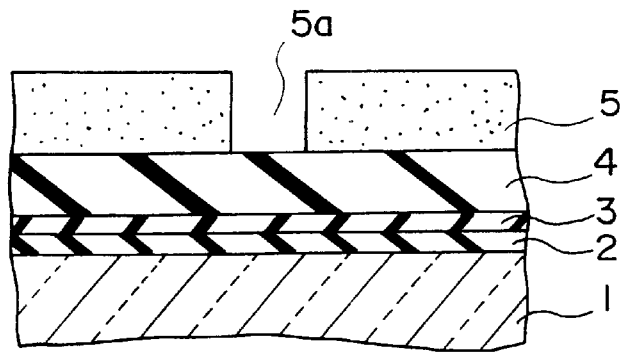
FIGS. 1A to 1G are sectional views showing steps of forming wirings of a semiconductor device according to a first embodiment of the present invention.

To begin with, steps for achieving a configuration shown in FIG. 1A will be explained.

A first interlayer insulating film 2 of 700 nm thickness for example is grown on a silicon substrate 1. The first interlayer insulating film 2 is formed to cover a semiconductor device formed on the silicon substrate 1.

Then, an etching stopper film 3 made of silicon nitride is grown on the first interlayer insulating film 2 by the plasma CVD method to have a thickness of 50 nm for example.

Then, a second interlayer insulating film 4 of 1 μm thickness is grown on the etching stopper film 3 by the plasma CVD method.

As the first interlayer insulating film 2 and the second interlayer insulating film 4, an $SiO_2$ film which is formed at a substrate temperature of about 300° C. by the plasma CVD method while using a silane gas and an oxygen gas as the reaction gas is employed. Normally such $SiO_2$ film formed at a low temperature condition is called an LTO (low temperature oxide).

Then, after formation of the second interlayer insulating film 4 has been completed, a resist 5 is coated on the second interlayer insulating film 4 and then a window 5a is formed by exposing and developing the resist 5. The window 5a is formed along the line on which the wiring will be arranged and a width of the window 5a is set to about 0.3 $\mu$m to 0.7 $\mu$m, for example.

Figure 1B:
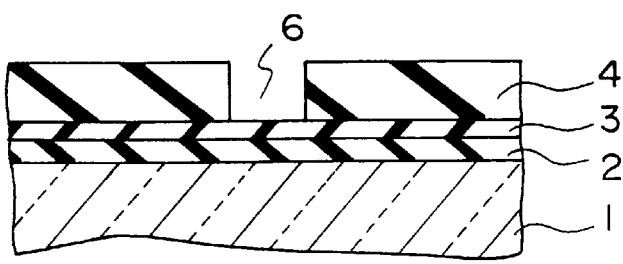

Next, as shown in FIG. 1B, a groove 6 is formed by etching the second interlayer insulating film 4 being exposed from the window 5a. If the reactive ion etching (RIE) method is employed as the method for etching the second interlayer insulating film 4 made of $SiO_2$ and also a mixed gas of $C_4F_6$, CO, and Ar is employed as the reaction gas, etching of the second interlayer insulating film 4 can be stopped by the etching stopper layer made of silicon nitride.

Figure 1C:
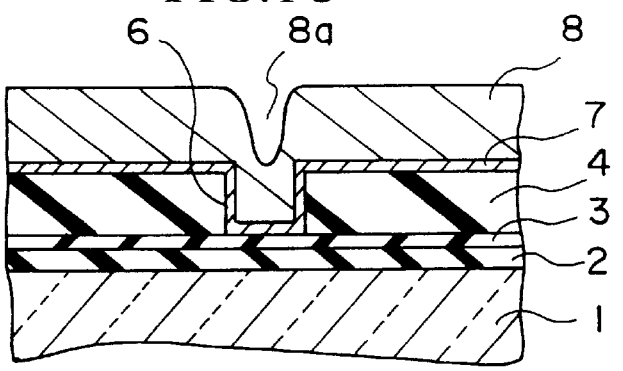

As shown in FIG. 1C, the resist 5 has been removed, and then a barrier metal film 7 of 50 nm thickness is grown on an upper surface of the second interlayer insulating film 4 and on an inner surface of the groove 6. As the barrier metal film 7, refractory metal alloy such as TiN, TaN, WN, TiSiN formed by the sputtering method can be employed. In turn, without release of vacuum, a first copper film 8 of 2 $\mu$m thickness is formed on the barrier metal film 7 by the sputtering method. A grain size of copper formed by the sputtering method is about 1 $\mu$m.

Figure 2:
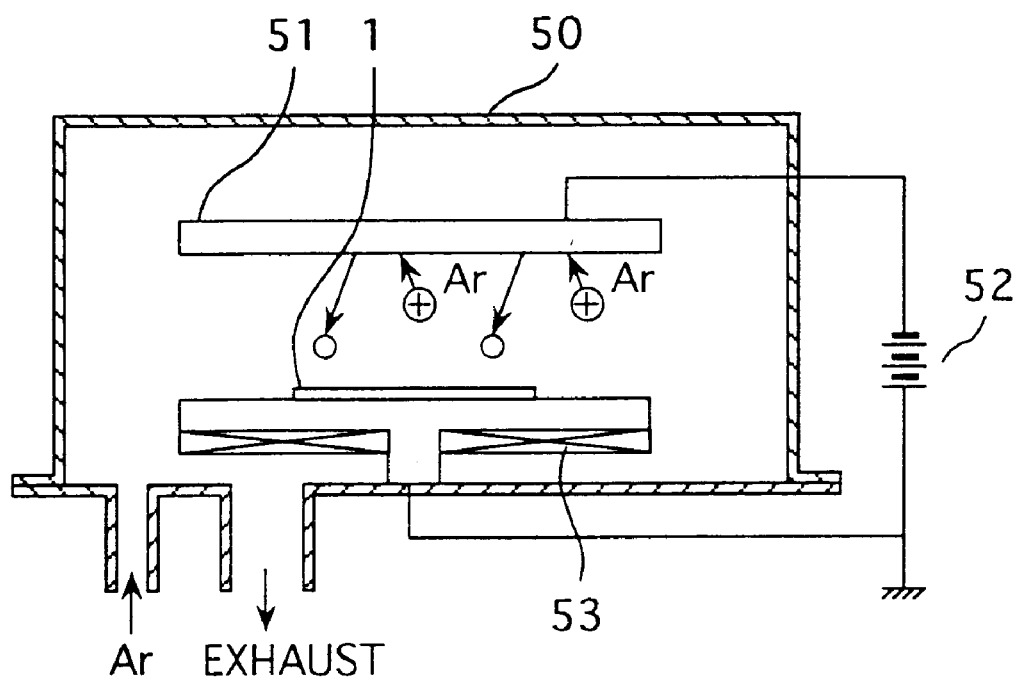
FIG. 2 is a example of sputtering equipment to form a copper film in the first embodiment of the present invention.

With the use of an equipment which has an achievable degree of vacuum is $9 \times 10^{-8}$ Torr, a film forming speed of about 1.25 $\mu$m/min can be obtained, under the sputtering conditions that an internal pressure of a chamber 50 into which argon is introduced is 2 mTorr, a power of a DC power supply 52 applied between a copper target 51 and the silicon substrate 1 is 12 kW, a distance between the copper target 51 and the silicon substrate 1 is 150 mm, and a substrate temperature is 150° C. heated by a heater 53, as shown in FIG. 2.

In case the first copper film 8 is to be grown, a sputtering equipment which has a high base degree of vacuum in which an achievable degree of vacuum is less than $2 \times 10^{-7}$ Torr may be used, and a distance between the copper target 51 and the silicon substrate 1 is set to more than 100 mm in atmosphere of the sputtering equipment of less than 5 mTorr, and the film forming speed of about 1.0 $\mu$m/min may be employed.

Also, the first copper film 8 is formed by changing a substrate temperature into two levels of less than 200° C. in the first step and more than 350° C. in the second step.

As a result, a lower portion of the first copper film 8 can be formed to have a good step coverage condition, while an upper portion of the first copper film 8 can be formed to obtain a higher growth rate.

Figure 1D:
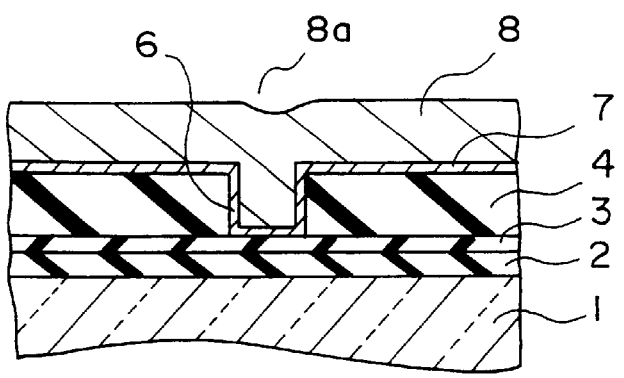

A concave portion 8a is formed on the first copper film 8 formed by the sputtering method over the groove 6. Therefore, as shown in FIG. 1D, the concave portion 8a can be made shallow when the first copper film 8 is heated at a temperature of 350° C. to 450° C. in hydrogen atmosphere whose pressure is 100 mTorr to be reflown.

Figure 1E:
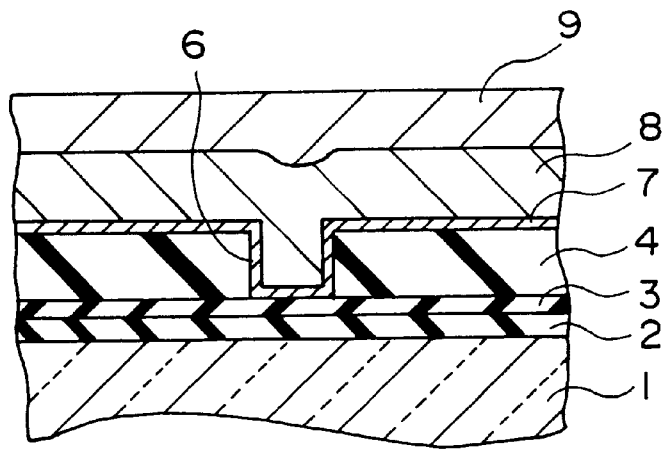

Subsequently, as shown in FIG. 1E, a second copper film 9 is grown on the first copper film 8 by the plating method to have a thickness of 1 $\mu$m.

In the case that the electrolytic plating method is employed, the second copper film 9 can be grown by supplying a pulse current, which has a current density of 2.5 $A/cm^2$ and a cycle of 10 ms, to the first copper film 8 in sulfuric acid bath. In this case, a growth rate of copper is about 1.8 $\mu$m/min. The copper plate is used as the copper supplying source.

In the case that the electroless plating method is employed, the second copper film 9 can be grown by immersing the silicon substrate 1 into a solution of copper sulfate and reducing agent (formalin) at about 25° C.

Since a depth of the concave portion 8a is reduced considerably after the first copper film 8 has been reflown, an upper surface of the second copper film 9 is not affected by a shape of the concave portion 8a to thus be planarized. Even if the second copper film 9 is formed by the chemical vapor deposition (CVD) method, the upper surface of the second copper film 9 can be formed flat.

Even when the second copper film 9 is formed by any method, an upper surface of the first copper film 8 in the groove 6 must be positioned at a higher location than an upper surface of the second interlayer insulating film 4 immediately after the first copper film 8 is formed or after the reflowing step. In addition, the silicon substrate 1 must be placed in a low pressure atmosphere without exposure to an atmosphere between the step of reflowing the first copper film 8 and the step of growing the second copper film 9.

Figure 1F:
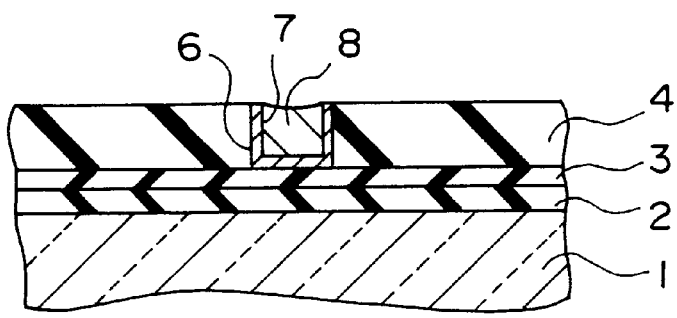

Then, as shown in FIG. 1F, the second copper film 9, the first copper film 8, and the barrier metal layer 7 are polished in order by the CMP method to remain the first copper film 8 and the barrier metal layer 7 only in the groove 6. A surface of the second copper film 9 is flat at start of the polishing and also there is no difference between CMP of the first copper film 8 and CMP of the second copper film 9. For this reason, an upper surface of the first copper film 8 in the groove 6 becomes substantially flat, so that the groove or the dishing has not appeared. The first copper film 8 remained in the groove 6 is used as the wiring.

As the polishing conditions for the CMP method, for example, a slurry containing $Al_2O_3$ like XJFW 8099 manufactured by Rodel Corporation and a polishing pad of IC-1000/Suba 400 manufactured by Rodel Corporation are employed, a rotational speed of a surface plate provided on the polishing pad side is set to 20 to 160 rpm, a rotational speed of a surface plate provided on the silicon substrate 1 side is set to 40 to 160 rpm, a polishing speed is set to 0.4 to 2.0 $\mu$m/min, and a pressure applied to the polishing pad to the silicon substrate 1 side is set to 250 $g/cm^2$.

Figure 1G:
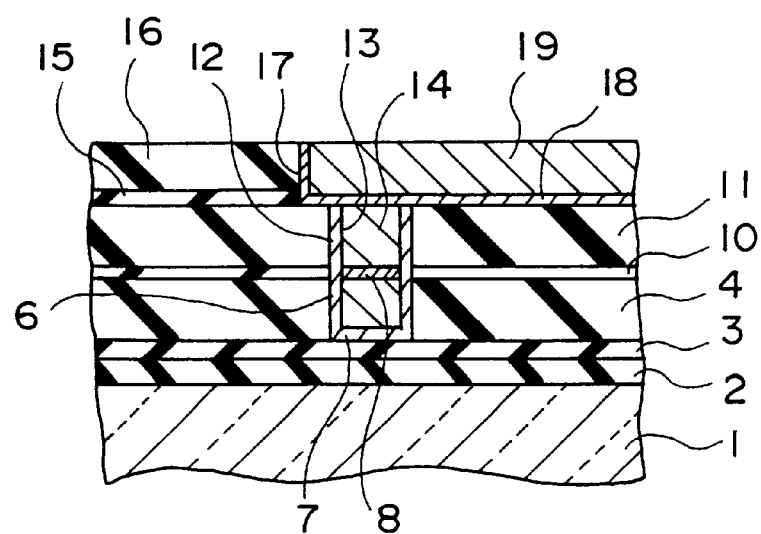

Then, as shown in FIG. 1G, a silicon nitride film 10 to cover the second interlayer insulating film 4 and the first copper film 8 is grown by plasma CVD to have a thickness of 50 nm, and then a third interlayer insulating film 11 made of a low temperature oxide film is formed on the silicon nitride film 10. Then, a plug hole 12 which is connected to the groove 6 is formed in the third interlayer insulating film 11 and the silicon nitride film 10. Then, a plug consisting of a barrier metal film 13 and a copper film 14 is formed in the plug hole 12, and then an etching stopper layer 15 made of silicon nitride and a fourth interlayer insulating film 16 made of a low temperature oxide film are formed in sequence thereon. Then, an upper groove 17 to be connected to the plug is formed in the fourth interlayer insulating film 16 and the etching stopper layer 15, and then the upper groove 17 is embedded by a barrier metal layer 18 and a copper film 19 via the same wiring steps as those in FIG. 1F, whereby an upper wiring is formed. As a result, a so-called dual damascene structure which has an insulating film hole having a via structure can be formed.

In this case, tungsten which is selectively grown may be employed as the plug embedded into the plug hole 12. Also, a TiN film formed by MOCVD may be employed as the barrier metal films 7, 18. Also, the second copper film 9 may be formed by the CVD method in place of the plating method. In case this CVD method is used, β-diketonate material may be employed.

With the above steps, since the first copper film 8 is formed by the sputtering method, a grain size of copper becomes large so that the wiring with good electromigration resistance can be formed in the groove 6.

Moreover, the second copper film 9 is formed on the first copper film 8 by the plating or the CVD after the first copper film 8 is reflown, and then the second copper film 9 and the first copper film 8 are polished by the chemical mechanical polishing.

Accordingly, since the concave portion 8a of the first copper film 8, which is generated over the groove 6, is made shallow and then is embedded by the second copper film 9, an upper surface of the second copper film 9 becomes flat. As a result, neither groove nor dishing is generated in the first copper film 8 which remains in the groove 6 as the wiring after the polishing by the CMP method, so that increase in resistance of the wiring can be prevented.

Next, experimental results of the electromigration in the above wiring will be explained.

A Table 1 shows experimental results of the electromigration in the copper wiring having a wiring depth of 0.4 μm, which is formed by above wiring forming steps according to the first embodiment.

In Table 1, W is a wiring width, J is a current density, $T_a$ is an examination temperature, and $T_{50}$ is a time when 50% defect due to the electromigration is caused in a plurality of samples.

TABLE 1

| Wafer number | W (μm) | J(A/cm²) | $T_a$ (° C.) | $T_{50}$ (hour) |
|---|---|---|---|---|
| 1 | 0.44 | 1 × 10⁷ | 200 | 200 |
| 2 | 0.44 | 1 × 10⁷ | 225 | 66 |
| 3 | 0.44 | 1 × 10⁷ | 250 | 31 |
| 4 | 0.44 | 5 × 10⁶ | 250 | 382 |
| 5 | 0.44 | 1.5 × 10⁷ | 250 | 2 |
| 6 | 2.00 | 1 × 10⁷ | 250 | 3 |

When the density of the current flowing through the copper wiring with the wafer number 1 is converted into 5×10⁶ A/cm², $T_{50}$ becomes 1100 hours under the conditions that the wiring width is 0.44 μm and the examination temperature is 200° C.

On the contrary, according to the electromigration examination of the wiring which is formed by the copper film being embedded into the groove by the CVD method of the prior art, results shown in Table 2 have been derived. From these results, it can be understood that the electromigration resistance can be improved in the first embodiment.

TABLE 2

| Wafer number | W (μm) | J(A/cm²) | $T_a$ (° C.) | $T_{50}$ (hour) |
|---|---|---|---|---|
| prior art 1 | 0.3 | 5 × 10⁶ | 200 | 93 |
| prior art 2 | 1.0 | 5 × 10⁶ | 200 | 21 |

According to the first embodiment, it is to be noted that, when these experimental results are converted, the defect of less than 0.1% can be assured for 1×10⁵ hours at 110° C. and the current of more than 1×10⁶ A/cm² can be supplied.

A following equation is applied in such conversion.

$$T_{50}=A*J^N*\exp(Ea/(Kb*T))$$

Where A is a constant, T is an absolute temperature, Ea is an activation energy, Kb is a Boltzmann constant, J is a current density, and N is an index of the current density. However, N is set to −2.46 and Ea is set to 0.76 eV.

(Second Embodiment)

In the first embodiment, since the first copper film 8 is formed thicker than the second interlayer insulating film 4, the groove 6 can be filled completely with the first copper film 8.

However, there is the case where sometimes cavities may be formed in the first copper film in the groove 6 according to the film forming conditions in sputtering and the aspect ratio of the groove, nevertheless such cavities cannot be perfectly removed by the above reflowing step. In such case, a method described in the following may be employed.

Figure 3A:
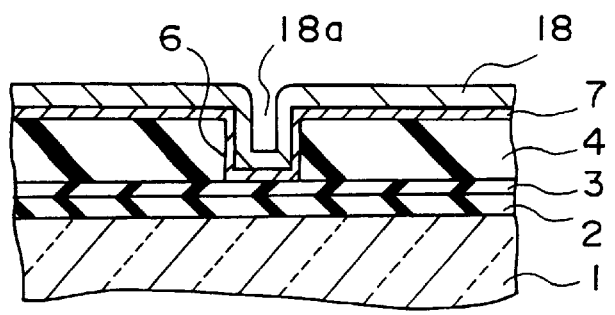
FIGS. 3A to 3D are sectional views showing steps of forming wirings of a semiconductor device according to a second embodiment of the present invention.

That is, as shown in FIG. 3A, a rate of a cross section of the first copper film 18 occupied in the groove 6 to a cross section of the groove 6 is set smaller than 1 but larger than ½ of the cross section of the groove 6 by forming the first copper film 18 thin like about 0.8 μm, for example, after the barrier metal 7 is formed. In other words, a concave portion 18a of the first copper film 18 in the groove 6 is positioned at a lower location than an upper surface of the second interlayer insulating film 4.

Figure 3B:
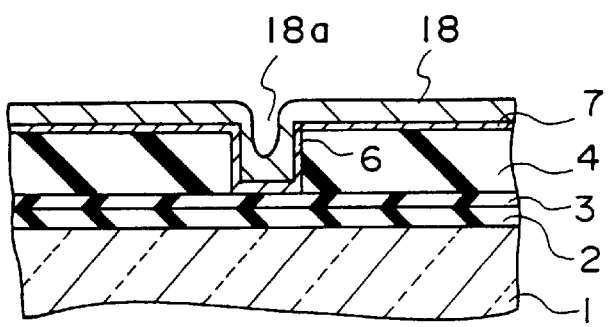

Then, as shown in FIG. 3B, the first copper film 18 is heated at a temperature of 350° C. to 400° C. in hydrogen atmosphere having a pressure of 100 mTorr to reflow. Thus, a depth of the concave portion 18a can be shallowed.

Figure 3C:
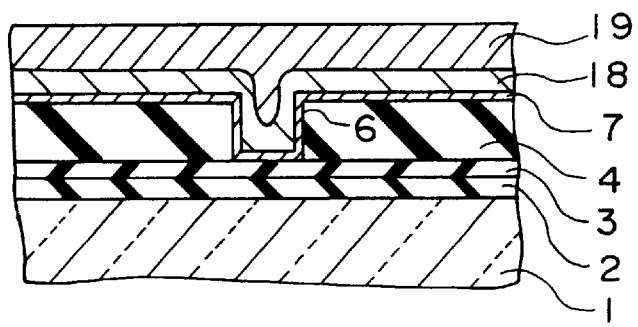

In turn, as shown in FIG. 3C, a second copper film 19 is grown on the first copper film 18 by the CVD method to have a thickness of 0.4 μm. In this case, β-diketonate material is employed as a source gas. Hence, the concave portion 18a can be embedded by the second copper film 19 and also an upper surface of the second copper film 19 can be planarized as a whole.

Figure 3D:
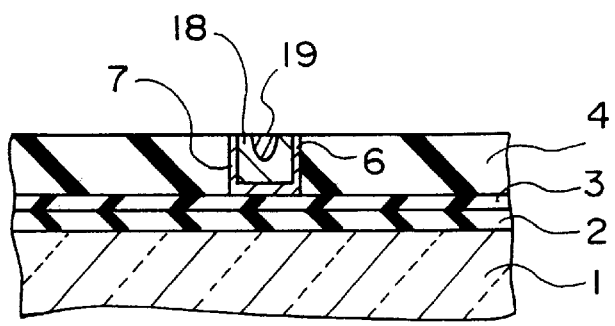

Then, as shown in FIG. 3D, the second copper film 19, the first copper film 18, and the barrier metal film 7 are left only in the groove 6 by polishing them by using the CMP method. They are used as the wiring. In this case, the first copper film 18 has a U-shaped sectional shape and then the second copper film 19 is embedded into the U-shaped sectional shape of the first copper film 18.

An upper area of the concave portion 18a of the first copper film 18 can be formed wider than a lower area thereof in the groove 6 if a thickness of the first copper film 18 is controlled in the above manner. Therefore, no cavity remains in the groove 6 after the first copper film 18 has been reflown, as shown in FIG. 3B. In addition, since a depth of the concave portion 18a of the first copper film 18 becomes shallow by the reflowing step, a shape of the concave portion 18a never remains on the second copper film 19 even after the second copper film 19 has been formed on the first copper film 18.

The concave portion 18a can be formed shallow even when the second copper film 19 is formed by the plating method. Therefore, the substantial aspect ratio becomes smaller than 1, and thus no cavity is generated in the second copper film 19 and also increase in the resistivity can be prevented.

As a result, after the second copper film 19, the first copper film 18, and the barrier metal film 7 have been polished, the first copper film 18 and the second copper film 19 remain in the groove 6. But neither groove nor dishing is generated in the groove 6 and also increase in the resistivity can be prevented. In addition, since the first copper film 18 formed by the sputtering method occupies more than ½ in the groove 6, the electromigration resistance can be ensured sufficiently.

In this case, the lowest area of the upper surface of the first copper film 8 formed in the groove 6 may be positioned at a higher location than a half of a depth of the groove 6 immediately after the first copper film 8 is formed or after the reflowing step. Also, a rate of the cross section of the first copper film 18 occupied in the groove 6 to a cross section of the groove 6 may be set larger than a half of the cross section of the groove 6 immediately after the first copper film 18 is formed or after the reflowing step.

As described above, according to the present invention, the groove is formed on the insulating film, then the first copper film is formed in the groove by the sputtering method, then the first copper film is heated to reflow, then the second copper film is formed on the first copper film by the chemical vapor deposition or the plating, then the first copper film and the second copper film are removed from the surface of the insulating film by chemical mechanical polishing. Therefore, the concave portion of the first copper film formed in the groove can be made shallow, and as a result the upper surface of the second copper film formed on the first copper film can be formed flat. Accordingly, generation of groove or dishing in the copper film remaining in the groove after the polishing can be prevented.

Furthermore, because the first copper film being formed by the sputtering remains in the groove, the copper film acting as the wiring in the groove can have the sufficient electromigration resistance.

What is claimed is:

1. A method of manufacturing a semiconductor device comprising the steps of:

forming a groove in an insulating film formed over a semiconductor substrate;

forming a first copper film on the insulating film and in the groove by sputtering using a target;

reflowing the first copper film by heating it;

forming a second copper film on the first copper film by plating or chemical vapor deposition; and removing the second copper film and the first copper film on the insulating film by chemical mechanical polishing to remain at least the first copper film in the groove.

2. A method of manufacturing a semiconductor device according to claim 1, wherein the step of reflowing the first copper film is executed at a substrate temperature of 350° C. to 450° C.

3. A method of manufacturing a semiconductor device according to claim 2, wherein the step of reflowing the first copper film is excuted in hydrogen atmosphere.

4. A method of manufacturing a semiconductor device according to claim 1, before forming the first copper film, forming a barrier metal film on the insulating film and an innerface of the groove.

5. A method of manufacturing a semiconductor device according to claim 4, the barrier metal film is made of the refractory metal compound.

6. A method of manufacturing a semiconductor device according to claim 1, wherein the first copper film is formed by a sputtering equipment having a high base degree of vacuum in which an achievable degree of vacuum is less than $2 \times 10^{-7}$ Torr, and is grown at atmosphere of less than 5 mTorr while setting a distance between the target and the semiconductor substrate to more than 100 mm.

7. A method of manufacturing a semiconductor device according to claim 3, wherein the first copper film is formed by changing a substrate temperature into two levels of less than 200° C. in a first step and more than 350° C. in a second step.

8. A method of manufacturing a semiconductor device according to claim 1, wherein an upper surface of the first copper film formed in the groove is positioned at a higher location than an upper surface of the insulating film immediately after the first copper film is formed or after the reflowing step.

9. A method of manufacturing a semiconductor device according to claim 1, wherein a lowest area of an upper surface of the first copper film in the groove is positioned at a higher location than a half of a depth of the groove immediately after the first copper film forming step or after the reflowing step.

10. A method of manufacturing a semiconductor device according to claim 1, wherein a rate of a cross section of the first copper film occupied in the groove to a cross section of the groove is larger than a half of the cross section of the groove immediately after the first copper film is formed or after the reflowing step.

11. A method of manufacturing a semiconductor device according to claim 1, wherein the semiconductor substrate is placed in a low pressure atmosphere without exposure to an atmosphere between the step of reflowing the first copper film and the step of forming the second copper film.

12. A method of manufacturing a semiconductor device according to claim 1, wherein an upper surface of the first copper film in the groove is positioned at a higher location than an upper surface of the insulating film after the first copper film is formed.

13. A method of manufacturing a semiconductor device comprising the steps of:

forming a groove in an insulating film formed over a semiconductor substrate;

forming a first copper film on the insulating film and in the groove by sputtering using a target, the first copper film having an upper surface in which a lowest area is positioned at a higher location than a half of depth of the groove;

forming a second copper film on the first copper film by plating or chemical vapor deposition; and removing the second copper film and the first copper film on the insulating film by chemical mechanical polishing to remain at least the first copper film in the groove.

* * * * *